(12) United States Patent
Suwald

(10) Patent No.: US 10,372,283 B2
(45) Date of Patent: Aug. 6, 2019

(54) ELECTRONIC DEVICE

(71) Applicant: NXP B.V., Eindhoven (NL)

(72) Inventor: Thomas Suwald, Hamburg (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/872,980

(22) Filed: Jan. 16, 2018

(65) Prior Publication Data

US 2018/0203544 A1 Jul. 19, 2018

(30) Foreign Application Priority Data

Jan. 16, 2017 (EP) .................................... 17151676

(51) Int. Cl.
| | |
|---|---|
| G09G 5/00 | (2006.01) |
| G06F 3/044 | (2006.01) |
| G06F 3/041 | (2006.01) |
| G06K 19/07 | (2006.01) |
| H03K 17/96 | (2006.01) |
| G11C 27/02 | (2006.01) |

(52) U.S. Cl.
CPC ............ *G06F 3/044* (2013.01); *G06F 3/0416* (2013.01); *G06K 19/0723* (2013.01); *H03K 17/9622* (2013.01); *G06F 2203/04103* (2013.01); *G11C 27/024* (2013.01); *H03K 2217/96074* (2013.01)

(58) Field of Classification Search
CPC .............. G06F 3/044; G06F 3/0416; G06F 2203/04103; G06K 19/0723; H03K 17/9622
USPC ................................................. 345/173, 174
See application file for complete search history.

(56) References Cited

U.S. PATENT DOCUMENTS

| | | |
|---|---|---|
| 8,446,158 B1 | 5/2013 | Jansson |
| 9,317,164 B2 | 4/2016 | Suwald |
| 9,406,013 B2 | 8/2016 | Suwald |
| 2007/0046299 A1 | 3/2007 | Hargreaves et al. |

(Continued)

FOREIGN PATENT DOCUMENTS

| | | |
|---|---|---|
| EP | 2 717 136 A1 | 4/2014 |
| EP | 2 667 156 B1 | 10/2015 |
| EP | 3 057 235 A1 | 8/2016 |

OTHER PUBLICATIONS

Extended European Search Report for Patent Appln. No. 17151676.8 (dated Jul. 18, 2017).

(Continued)

*Primary Examiner* — Jennifer T Nguyen

(57) ABSTRACT

According to a first aspect of the present disclosure, an electronic device for use in a touch-based user interface is provided, the electronic device comprising a first capacitor, a second capacitor, a third capacitor, and an analog-to-digital converter, wherein: the first capacitor and the second capacitor are switchably coupled to each other; the first capacitor is switchably coupled to an input of the analog-to-digital converter; the second capacitor is coupled to the input of the analog-to-digital converter; the third capacitor is coupled to the first capacitor; the third capacitor is switchably coupled to the second capacitor; the third capacitor is switchably coupled to the input of the analog-to-digital converter. According to a second aspect of the present disclosure, a corresponding method of manufacturing an electronic device for use in a touch-based user interface is conceived.

12 Claims, 8 Drawing Sheets

(56) References Cited

U.S. PATENT DOCUMENTS

2014/0091815 A1* 4/2014 Suwald .............. G01R 27/2605
324/658
2016/0170532 A1 6/2016 Suwald
2017/0161539 A1* 6/2017 Lo ........................ G06K 9/0002

OTHER PUBLICATIONS

Anonymous: "ATmega ADC tutorial | Open Music Labs", 5 pgs., retrieved from the internet Jul. 6, 2017 at: http://www.openmusiclabs.com/learning/digital/atmega-adc/index.html (Jan. 1, 2016).

* cited by examiner

Filter coefficient: 0 < a < 1

| | | |
|---|---|---|
| Xn1 | Xn2 | Xn3 |
| Xn4 | Xn5 | Xn6 |
| Xn7 | Xn8 | Xn9 |

1000

| | | |
|---|---|---|
| Wx=-1<br>Wy=1 | Wx=0<br>Wy=1 | Wx=1<br>Wy=1 |
| Wx=-1<br>Wy=0 | Wx=0<br>Wy=0 | Wx=1<br>Wy=0 |
| Wx=-1<br>Wy=-1 | Wx=0<br>Wy=-1 | Wx=1<br>Wy=-1 |

ELECTRONIC DEVICE

CROSS-REFERENCE TO RELATED APPLICATIONS

This application claims the priority under 35 U.S.C. § 119 of European patent application no. 17151676.8, filed on Jan. 16, 2017, the contents of which are incorporated by reference herein.

FIELD

The present disclosure relates to an electronic device for use in a touch-based user interface. Furthermore, the present disclosure relates to a corresponding method of manufacturing an electronic device.

BACKGROUND

Today, electronic devices such as smart cards are widely used in society. For example, smart cards may be used as electronic identity (eID) cards and payment cards bank cards). Although these cards are relatively secure due to their cryptographic capabilities, they are usually not equipped with a user interface suitable for entering user credentials, i.e. a so-called "authentication interface". As a consequence, most card users still enter their PIN code through personal computers and laptops, which increases the risk that their credentials are intercepted by malicious software such as Trojans and key-logger programs. Some smart cards have been equipped with embedded touch-based user interfaces, such as capacitive sensor structures. However, it may be difficult to implement a touch-based interface that accurately captures touch events while using only a small amount of power.

SUMMARY

According to a first aspect of the present disclosure, an electronic device for use in a touch-based user interface is provided, the electronic device comprising a first capacitor, a second capacitor, a third capacitor, and an analog-to-digital converter, wherein: the first capacitor and the second capacitor are switchably coupled to each other; the first capacitor is switchably coupled to an input of the analog-to-digital converter; the second capacitor is coupled to the input of the analog-to-digital converter; the third capacitor is coupled to the first capacitor; the third capacitor is switchably coupled to the second capacitor; the third capacitor is switchably coupled to the input of the analog-to-digital converter. In one or more embodiments, the third capacitor is implemented as a printed circuit board capacitor.

In one or more embodiments, the electronic device comprises a set of first capacitors.

In one or more embodiments, the electronic device is configured to derive individual capacitances on the first capacitors from partial sum values, wherein said partial sum values are obtained by measuring capacitances on subsets of the set of first capacitors. In one or more embodiments, the electronic device is further configured to measure capacitances on mutually different subsets of the set of first capacitors.

In one or more embodiments, the electronic device is further configured to apply a weighting factor to the partial sum values.

In one or more embodiments, the electronic device is further configured to regroup the weighted partial sum values, thereby yielding high-pass filter terms.

In one or more embodiments, the electronic device is further configured to filter the partial sum values.

In one or more embodiments, the electronic device is further configured to use an infinite-impulse-response filter for filtering the partial sum values.

In one or more embodiments, the first capacitors are coupled to general-purpose input/output pins.

In one or more embodiments, the general-purpose input/output pins, the analog-to-digital converter and the second capacitor form part of a microcontroller unit.

In one or more embodiments, a smart card comprises an electronic device of the kind set forth.

According to a second aspect of the present disclosure, a method of manufacturing an electronic device for use in a touch-based user interface is conceived, the method comprising providing the electronic device with a first capacitor, a second capacitor, a third capacitor, and an analog-to-digital converter, wherein: the first capacitor and the second capacitor are switchably coupled to each other; the first capacitor is switchably coupled to an input of the analog-to-digital converter; the second capacitor is coupled to the input of the analog-to-digital converter; the third capacitor is coupled to the first capacitor; the third capacitor is switchably coupled to the second capacitor; the third capacitor is switchably coupled to the input of the analog-to-digital converter.

DESCRIPTION OF DRAWINGS

Embodiments will be described in more detail with reference to the appended drawings, in which:

FIG. 10 shows an illustrative embodiment of a 9-field two-dimensional sensor;

DESCRIPTION OF EMBODIMENTS

Figure 1:
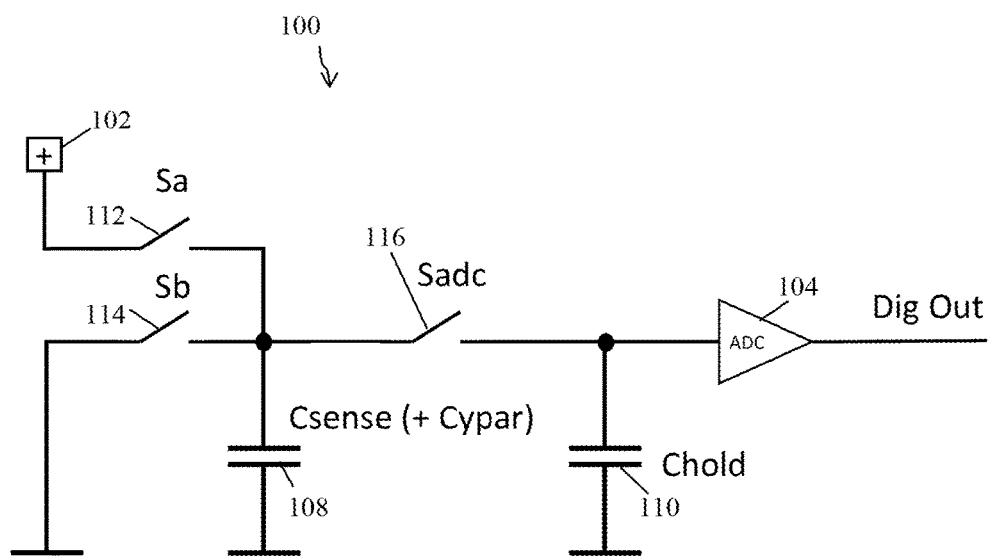
FIG. 1 shows an example of an electronic device.

FIG. 1 shows an example of an electronic device 100. The electronic device 100 comprises a first capacitor (sense capacitor) 108, a second capacitor (sample-and-hold capacitor) 110, and an analog-to-digital converter (ADC) 104. The first capacitor 108 and the second capacitor 110 are switchably coupled to each other (i.e. they are coupled to each other through a controllable switch 116). Furthermore, the first capacitor 108 is switchably coupled to an input of the analog-to-digital converter 104 (i.e., coupled through the controllable switch 116). Furthermore, the second capacitor 110 is coupled to the input of the analog-to-digital converter 104. In operation, the electronic device 100 may receive a supply voltage through a voltage input 102, and detect a touch event by measuring a change of the capacitance on the first capacitor (sense capacitor) 108.

In particular, when switch Sa 112 and switch Sadc 116 are closed, capacitor Chold 110 may be charged to a supply voltage $V_{DD}$ received on the voltage input 102. Then, switch Sadc 112 may be opened and the voltage level $V_{DD}$ may be held on capacitor Chold 110. In a next step, switch Sb 114 may be closed, which causes capacitor Csense 108 to discharge to zero. When capacitor Csense 108 is completely discharged switch Sb 114 may be opened. Then, switch Sadc 116 may be closed, so that charge sharing among capacitor Chold 110 and capacitor Csense 108 occurs. The resulting voltage at the input of the ADC 104 is indicative of the capacitance on the capacitor Csense 108. Then, switch Sadc 116 may be opened and the voltage held on capacitor Chold 110 may now be converted into a digital representation (Dig Out) by means of the ADC 104. The capacitance on the capacitor Csense 108 may change under the influence of an external object, e.g. a human finger. As a consequence, the voltage at the input of the ADC 104 and its digital representation (Dig Out) changes; this change can be used to detect the presence of the external object. The sense capacitor 108 may correspond to a certain position in an array of sensing elements (sense capacitors), and if the voltage at the input of the ADC 104 and its digital representation (Dig Out) changes, it is concluded that a touch event takes place at this position (this process is referred to as position capturing herein). Since the capacitor Csense 108 is used to sense the presence of, for example, the human finger, it may be referred to as a sense capacitor. Table 1 shows an example of a switching sequence of the electronic device 100.

TABLE 1

| Step | Sa | Sb | Sadc | Effect |
|---|---|---|---|---|
| 1 | Closed | Open | Closed | Charge $C_{HOLD}$ to $V_{DD}$ (=sampled noise is related to $V_{DD}$) |
| 2 | Closed | Open | Open | Disconnect $C_{HOLD}$ |
| 3 | Open | Closed | Open | Reset Csense (shortcut to Gnd for best noise behavior) |
| 4 | Open | Open | Open | Stop resetting Csense |
| 5 | Open | Open | Closed | Charge sharing $C_{SENSE} \| C_{HOLD}$ |
| 6 | Open | Open | Open | Hold + A/D conversion |

The electronic device 100 shown in FIG. 1 may have several disadvantages, for example a high power consumption and/or low sensitivity. Furthermore, it may only be applied to single-channel touch sensors. Furthermore, its application may be limited by the size of the sample-and-hold capacitor Chold 110, which may not be changed. Therefore, the electronic device 100 may not be able to support all sampling schemes. For instance, the electronic device 100 may not be able to support the sampling method presented in the European patent EP 2 667 156 B1, titled "Capacitive position sensor system". The presently disclosed device and method may overcome at least some of these shortcomings.

According to a first aspect of the present disclosure, an electronic device for use in a touch-based user interface is provided, the electronic device comprising a first capacitor, a second capacitor, a third capacitor, and an analog-to-digital converter, wherein: the first capacitor and the second capacitor are switchably coupled to each other; the first capacitor is switchably coupled to an input of the analog-to-digital converter; the second capacitor is coupled to the input of the analog-to-digital converter; the third capacitor is coupled to the first capacitor; the third capacitor is switchably coupled to the second capacitor; the third capacitor is switchably coupled to the input of the analog-to-digital converter. In particular, the third capacitor may be used to keep a voltage across the second capacitor within an optimal conversion range of the analog-to-digital converter. This, in turn, may enable a fast and accurate touch position capturing and calculation, thereby reducing the power consumption of sensing systems that comprise the presently disclosed electronic device.

Figure 2:
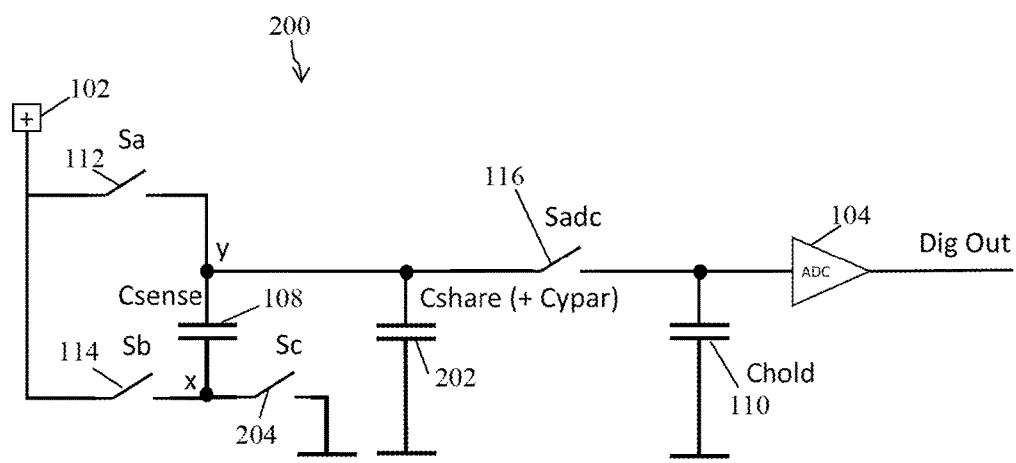
FIG. 2 shows an illustrative embodiment of an electronic device.

FIG. 2 shows an illustrative embodiment of an electronic device 200. The electronic device 200 comprises a first capacitor (sense capacitor) 108, a second capacitor (sample-and-hold capacitor) 110, a third capacitor 202, and an analog-to-digital converter (ADC) 104. The first capacitor 108 and the second capacitor 110 are switchably coupled to each other (i.e. they are coupled to each other through a controllable switch 116). Furthermore, the first capacitor 108 is switchably coupled to an input of the analog-to-digital converter 104 (i.e., coupled through the controllable switch 116). Furthermore, the second capacitor 110 is coupled to the input of the analog-to-digital converter 104. Furthermore, the third capacitor 202 is coupled to the first capacitor 108. Furthermore, the third capacitor 202 is switchably coupled to the second capacitor 110 (i.e., coupled through the controllable switch 116). Furthermore, the third capacitor 202 is switchably coupled to the input of the analog-to-digital converter 104 (i.e., coupled through the controllable switch 116). In operation, the electronic device 200 may receive a supply voltage through a voltage input 102, and detect a touch event by measuring a change of the capacitance on the first capacitor (sense capacitor) 108. As mentioned above, the third capacitor 202 may keep a voltage across the second capacitor 110 within an optimal conversion range of the analog-to-digital converter 104.

In particular, when the switches Sa 112, Sb 114 and Sadc 116 are closed, capacitors Cshare 202 and Chold 110 may be charged to a supply voltage $V_{DD}$ while Csense 108 may be discharged. Discharging of Csense 108 as well as charging Cshare 202 and Chold 110 may be stopped by opening switches Sa 112 and Sb 114. When closing switch Sc 204, charge sharing among Chold 110 and Csense 108 may occur. The resulting voltage at the input of the ADC 104 is indicative of the capacitance on capacitor Csense 108. Switch Sadc 116 may be opened and thus the ADC input voltage may be held on Chold 110 for conversion into a digital representation by means of the ADC 104. By adding more sense capacitors Csense and more switches Sb and Sc a multi-channel touch sensor is obtained, as will be explained with reference to FIG. 3. The capacitor Cshare 202 may comprise all parasitic capacitances Cpar, for instance the diffusion capacitances of switch Sa 112, wiring capacitances and track-to-bottom capacitances of the sensor capacitors attached to the y-node. The capacitor Cshare 202 is configured such that the voltage across Chold 110 stays within an optimal conversion range of the ADC 104. In one or more embodiments, the third capacitor (i.e., capacitor Cshare 202) is implemented as a printed circuit board (PCB) capacitor. More specifically, capacitor Cshare 202 may be implemented as a PCB capacitor made from neighboring tracks, in order to avoid placement of an additional component. Table 2 shows an example of a switching sequence of the electronic device 200.

TABLE 2

| Step | Sa | Sb | Sc | Sadc | Effect |
|------|------|------|--------|--------|--------|
| 1 | Closed | Closed | Open | Closed | Discharge $C_{SENSE}$, charge $C_{SHARE} \| C_{HOLD}$ to $V_{DD}$ (=sampled noise related to $V_{DD}$), |
| 2 | Open | Open | Open | Closed | Disconnect $C_{SENSE}$ |
| 3 | Open | Open | Closed | Closed | Charge sharing $C_{SENSE} \| C_{SHARE} \| C_{HOLD}$ |
| 4 | Open | Open | Open | Open | Hold + A/D conversion |

Figure 3:
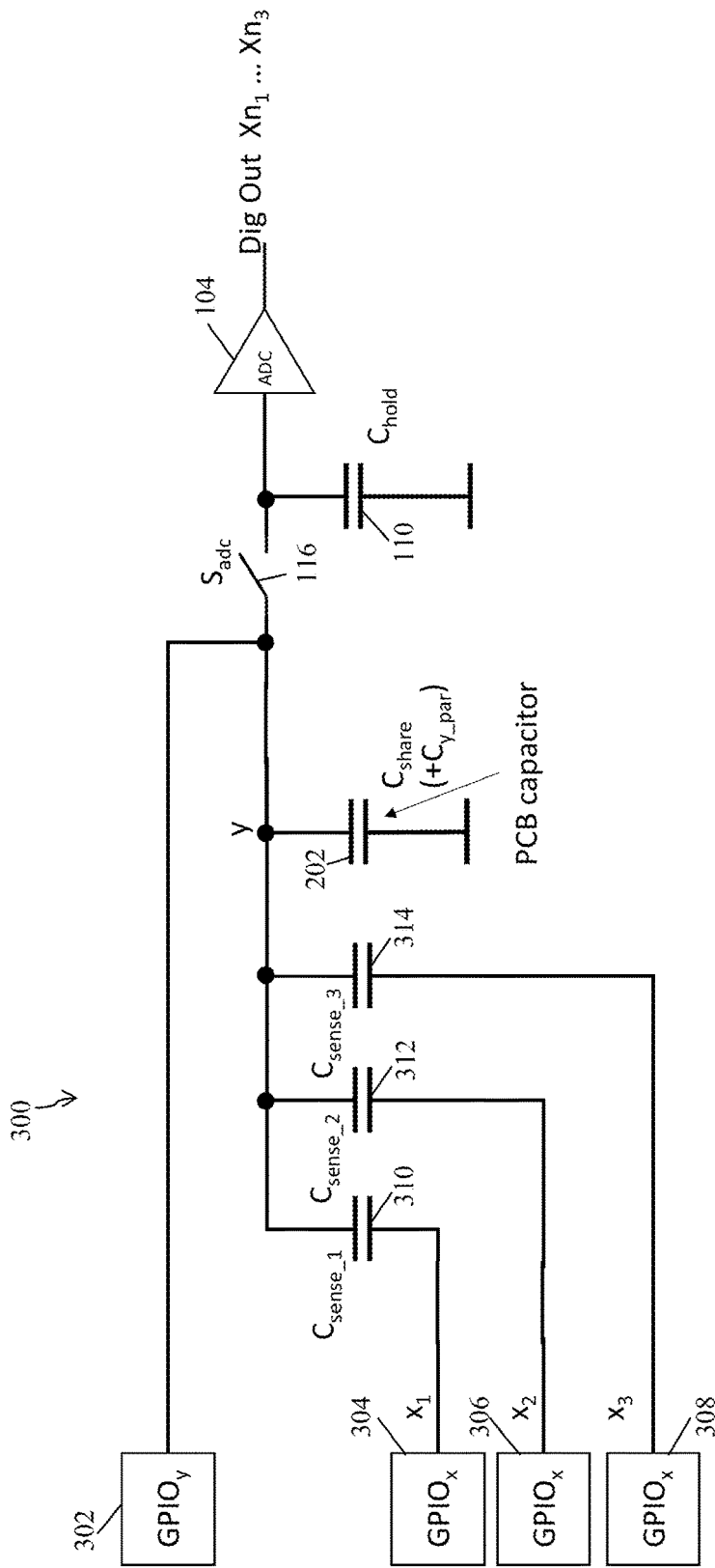
FIG. 3 shows another illustrative embodiment of an electronic device.

FIG. 3 shows an illustrative embodiment of an electronic device 300. The electronic device 200 comprises a set of first capacitors (sense capacitors) 310, 312, 314, a second capacitor (sample-and-hold capacitor) 110, a third capacitor 202, and an analog-to-digital converter (ADC) 104. The first capacitors 310, 312, 314 and the second capacitor 110 are switchably coupled to each other (i.e. they are coupled to each other through a controllable switch 116). Furthermore, the first capacitors 310, 312, 314 are switchably coupled to an input of the analog-to-digital converter 104 (i.e., coupled through the controllable switch 116). Furthermore, the second capacitor 110 is coupled to the input of the analog-to-digital converter 104. Furthermore, the third capacitor 202 is coupled to the first capacitors 310, 312, 314. Furthermore, the third capacitor 202 is switchably coupled to the second capacitor 110 (i.e., coupled through the controllable switch 116). Furthermore, the third capacitor 202 is switchably coupled to the input of the analog-to-digital converter 104 (i.e., coupled through the controllable switch 116). In operation, the electronic device 200 may receive a supply voltage through a voltage input 102, and detect a touch event by measuring a change of the capacitance on the first capacitors (sense capacitors) 310, 312, 314. As mentioned above, the third capacitor 202 may keep a voltage across the second capacitor 110 within an optimal conversion range of the analog-to-digital converter 104. Thus, in one or more embodiments, the electronic device 300 comprises a set of first capacitors (sense capacitors). In this way, multi-channel touch sensors may be supported as well.

In particular, in the embodiment shown in FIG. 3 general-purpose input/output pins GPIOs 304, 306, 308 may be used for activating the sense capacitors Csense_1 310, Csense_2 312, Csense_3 314. These GPIOs 304, 306, 308 may be controlled by a computer program such that a capacitance measurement method may be facilitated. At least two of the sense capacitors Csense_1 310, Csense_2 312, Csense_3 314 may be activated simultaneously by controlling the GPIOs as indicated in Table 3. The activated sensor capacitors may be connected to a supply voltage $V_{DD}$ by means of the related GPIOx. Switch Sadc 116 may be closed so as to charge Chold 110 and the parallel Cshare 202 to $V_{DD}$, which may be provided by GPIOy 302 set to a high-level output. The measurement may start by setting GPIOy 302 to tri-state. When the activated sense capacitors are connected to ground by setting GPIOx to a low-level output, charge sharing between the respective sense capacitor and Chold 110 may occur. Once the voltage across Chold 110 has settled analog-to-digital conversion may be executed by the ADC 104.

TABLE 3

| Step | GPIOx | GPIOy | Sadc | Effect |
|------|-------|-------|--------|--------|
| 1 | H | H | Closed | Discharge $C_{SENSE\_X}$, charge $C_{SHARE} \| C_{HOLD}$ to $V_{DD}$ (=sampled noise related to $V_{DD}$), |
| 2 | H | HiZ | Closed | Disconnect $C_{SENSE}$ |
| 3 | L | HiZ | Closed | Charge sharing $C_{SENSE} \| C_{SHARE} \| C_{HOLD}$ |
| 4 | L | HiZ | Open | Hold + A/D conversion |

In one or more embodiments, the electronic device 300 is configured to derive individual capacitances on the sense capacitors Csense_1 310, Csense_2 312, Csense_3 314, from partial sum values. In particular, the partial sum values are obtained by measuring and adding capacitances on subsets of the set of sense capacitors Csense_1 310, Csense_2 312, Csense_3 314. Table 4 shows an example of this principle. In particular, it shows how individual capacitances on the three sense capacitors shown in FIG. 3 are derived from partial sum values ($\Sigma_1, \Sigma_2, \Sigma_3$). The partial sum values are obtained by measuring capacitances on subsets of the set of sense capacitors. For instance, in the first step (first scan), the capacitance on two sense capacitors (Csense_2 312, Csense_3 314) is measured: this does not mean that the individual capacitances on these two sense capacitors is measured, but that a single capacitance measurement is performed on both of them (i.e., a combined capacitance). Subsequently, the capacitances on other subsets of the set of sense capacitors are measured in the second and third step. Subsequently, the individual capacitances on the three capacitors (Csense_2 312, Csense_3 314) are derived from the partial sum values. Thus, in the given example two sensing capacitors may be evaluated in every scan cycle. Even if combinations of capacitances are evaluated it may be possible to calculate the individual capacitance values after three scans from the individual sensing results. As long as the capacitance readings Xn1 to Xn3 stay constant during three scans the scanning principle according to Table 4 provides an FIR low-pass filter characteristic which may remove high-frequent noise components. As shown in Table 4, in a practical and efficient implementation, the electronic device 300 is configured to measure capacitances on mutually different subsets of the set of sense capacitors Csense_1 310, Csense_2 312. Csense_3 314.

TABLE 4

| Scan | $X_1$ | $X_2$ | $X_3$ | Comment |
|------|-----|-----|-----|---------|
| 1 | — | X | X | $\Sigma_1 = 0 + Xn_2 + Xn_3$ |
| 2 | X | — | X | $\Sigma_2 = Xn_1 + 0 + Xn_3$ |
| 3 | X | X | — | $\Sigma_3 = Xn_1 + Xn_2 + 0$ |
| 1-3 | | | | $\Sigma = 2*Xn_1 + 2*Xn_2 + 2*Xn_3$ |
| | | | | $2*Xn_1 = \Sigma - 2*\Sigma_1$ |
| | | | | $2*Xn_2 = \Sigma - 2*\Sigma_2$ |
| | | | | $2*Xn_3 = \Sigma - 2*\Sigma_3$ |

In some embodiments a microcontroller may be used that does not have a sample-and-hold stage preceding the analog-to-digital converter. In this case switch Sadc is kept closed during all steps and capacitor Cshare is used as sample-and-hold capacitor as shown in Table 5.

TABLE 5

| Step | GPIOx | GPIOy | Sadc | Effect |
|------|-------|-------|------|--------|
| 1 | H | H | Closed | Discharge $C_{SENSE\_X}$, charge $C_{SHARE} \| C_{HOLD}$ to $V_{DD}$ (=sampled noise related to $V_{DD}$), |
| 2 | HiZ | H | Closed | Disconnect $C_{SENSE}$ |
| 3 | L | H | Closed | Charge sharing $C_{SENSE} \| C_{SHARE} \| C_{HOLD}$ |
| 4 | HiZ | H | Closed | Hold + A/D conversion |

Figure 4:
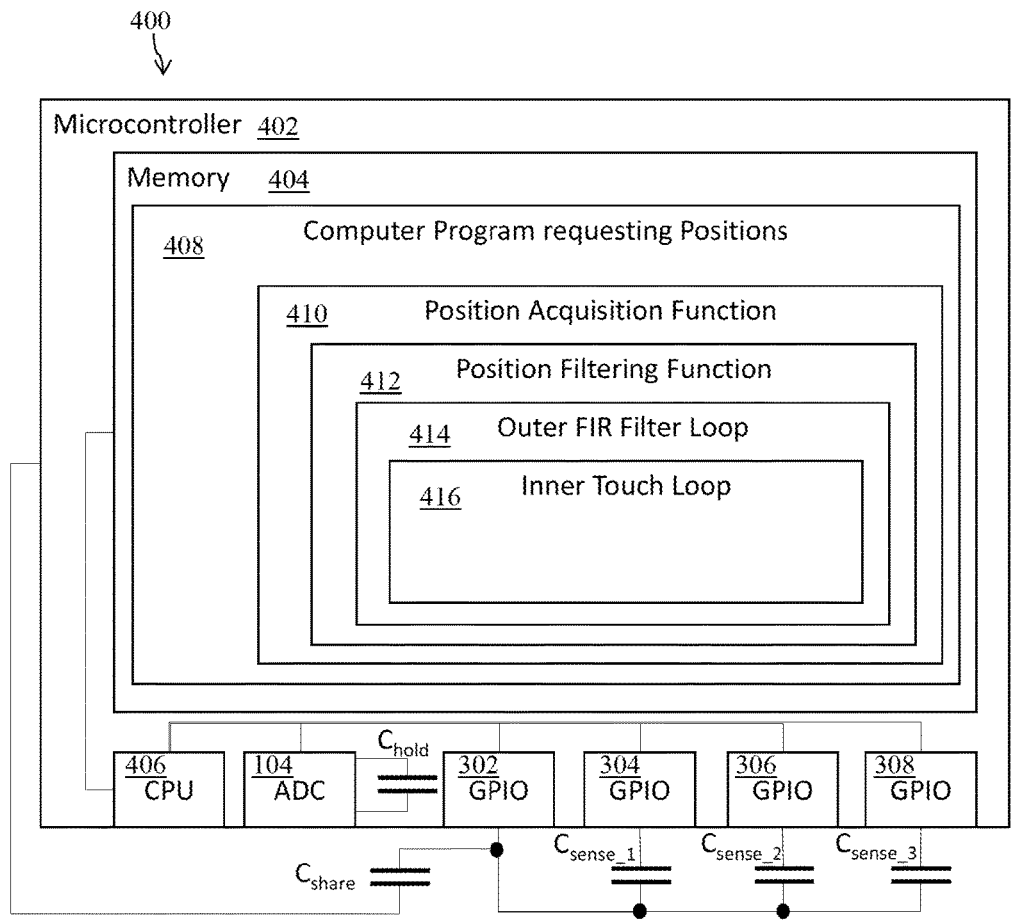
FIG. 4 shows an illustrative embodiment of a position capturing device.

FIG. 4 shows an illustrative embodiment of a position capturing device 400. The device 400 comprises a microcontroller 402 that may be configured to execute a computer program 408 stored in a memory 404. The microcontroller 402 also comprises general-purpose input/output pins 302, 304, 306, 308, an analog-to-digital converter 104, a central processing unit 406, sense capacitors Csense_1, Csense_2, Csense_3, and capacitor Cshare. The computer program 408 may request, when executed by the processing unit 406, positions of touch events on a sensor (i.e., a touch-based user interface). For this purpose the computer program 408 may invoke a position acquisition function 410. The position acquisition function 410 may in turn invoke a position filtering function 412. The position filtering function 412 may invoke an outer FIR-loop 414, which finally may invoke an inner touch loop 416. The inner touch loop 416 may comprise processing steps as shown in Table 5.

Figure 5:
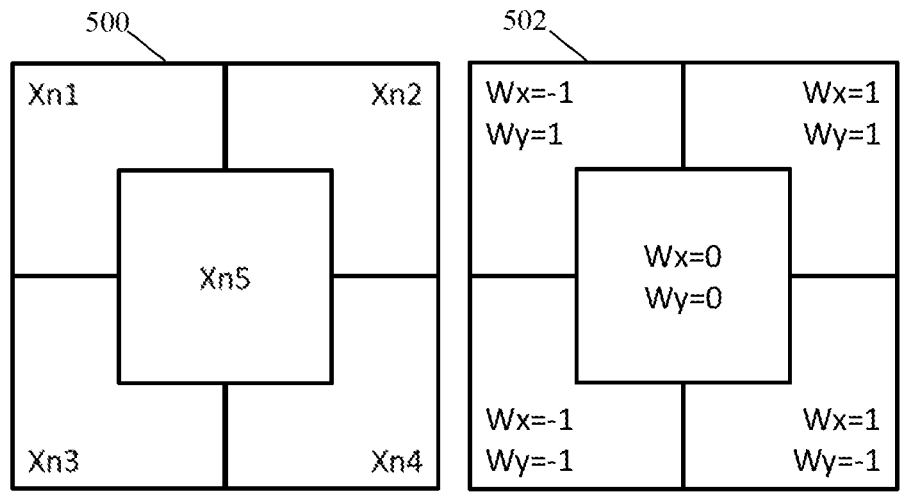
FIG. 5 shows an illustrative embodiment of a 5-field two-dimensional sensor.

FIG. 5 shows an illustrative embodiment of a 5-field two-dimensional sensor. In particular, on the left side a 5-field two-dimensional sensor layout 500 is shown. On the right side the same sensor is shown, in which weights 502 have been assigned to each sensing element. This sensor layout has been described in the European patent application EP 3 035 173 A1, titled "User interface unit, electronic device and manufacturing method", which is incorporated herein by reference. In accordance with the present disclosure, this 5-field two-dimensional sensor may be implemented using an electronic device of the kind set forth. For example, the sensor may be implemented by an arrangement similar to that shown in FIG. 3, comprising five sense capacitors instead of three.

The evaluation of the five sense capacitors is illustrated in Table 6. After five evaluations of different subsets of the sense capacitors the capacitances of each individual sense capacitor may be obtained by means of a calculation. In a consecutive step the x- and y-position of the touch event may be calculated. In a following step the x- and y-positions may be low-pass filtered in order to remove position noise.

TABLE 6

| Scan | $X_1$ | $X_2$ | $X_3$ | $X_3$ | $X_3$ | Comment |
|------|-------|-------|-------|-------|-------|---------|
| 1 |  | X | X | X | X | $\Sigma_1 = 0 + Xn_2 + Xn_3 + Xn_4 + Xn_5$ |
| 2 | X |  | X | X | X | $\Sigma_2 = Xn_1 + 0 + Xn_3 + Xn_4 + Xn_5$ |
| 3 | X | X |  | X | X | $\Sigma_3 = Xn_1 + Xn_2 + 0 + Xn_4 + Xn_5$ |
| 4 | X | X | X |  | X | $\Sigma_4 = Xn_1 + Xn_2 + Xn_3 + 0 + Xn_5$ |
| 5 | X | X | X | X |  | $\Sigma_5 = Xn_1 + Xn_2 + Xn_3 + Xn_4 + 0$ |
| 1-5 |  |  |  |  |  | $\Sigma = \Sigma_1 + \Sigma_2 + \Sigma_3 + \Sigma_4 + \Sigma_5$ |
|  |  |  |  |  |  | $\Sigma = 4*Xn_1 + 4*Xn_2 + 4*Xn_3 + 4*Xn_4 + 4*Xn_5$ |
|  |  |  |  |  |  | $4*Xn_1 = \Sigma - 4*\Sigma_1$ |
|  |  |  |  |  |  | $4*Xn_2 = \Sigma - 4*\Sigma_2$ |
|  |  |  |  |  |  | $4*Xn_3 = \Sigma - 4*\Sigma_3$ |
|  |  |  |  |  |  | $4*Xn_4 = \Sigma - 4*\Sigma_4$ |
|  |  |  |  |  |  | $4*Xn_5 = \Sigma - 4*\Sigma_5$ |

In accordance with the present disclosure, the position calculation method may be improved so as achieve higher position sample rates. In particular, the x- and y-positions may be calculated directly from the sum samples $\Sigma_1$ to $\Sigma_n$ in case of an n-field sensor. As an example, the x- and y-positions of a finger on a 5-field sensor may be directly obtained from weighted filter components $\Sigma_1$ to $\Sigma_5$ as shown below:

$$Pos_X = (-\sum +4*\sum_1 +\sum -4*\sum_2 -\sum +4*\sum_3 +\sum -4*\sum_4)/\sum$$

$$Pos_X = 4*(\sum_1 -\sum_2 +\sum_3 -\sum_4)/\sum$$

$$Pos_X = 4*((\sum_3 -\sum_2) + (\sum_1 -\sum_4))/\sum$$

$$Pos_Y = (\sum -4*\sum_1 +\sum -4*\sum_2 -\sum +4*\sum_3 -\sum +4*\sum_4)/\sum$$

$$Pos_Y = 4*(-\sum_1 -\sum_2 +\sum_3 +\sum_4)/\sum$$

$$Pos_Y = 4*((\sum_3 -\sum_2) - (\sum_1 -\sum_4))/\sum$$

The weighted sums may be regrouped, yielding the two high-pass filter terms ($\Sigma_1-\Sigma_4$) and ($\Sigma_3-\Sigma_2$). These high-pass filter terms may remove DC-components from the position components. Only two divisions and a few subtraction, addition and shift operations may be required to obtain one x/y-position from the position components. Thus, in one or more embodiments, the partial sum values may be weighted and the weighted partial sum values may be regrouped. Thereby, hardware savings may be achieved.

Figure 6:
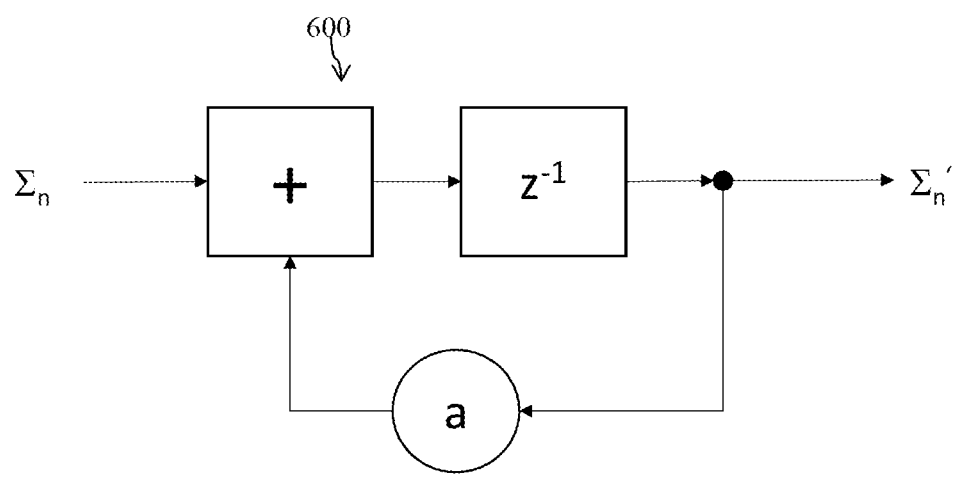
FIG. 6 shows an illustrative embodiment of filtering of partial sum values.

FIG. 6 shows an illustrative embodiment of filtering 600 of partial sum values. In particular, it may also be desirable to reduce position noise. In accordance with the present disclosure, in order to reduce position noise position components may be filtered before calculating an x- and y-position. In particular, the position components (i.e., partial sum values) may be filtered using an infinite-impulse-response (IIR) filter. This is shown schematically in FIG. 6. The advantage of an IIR filter is that it may be interleaved with the capacitance measuring processing steps in such a way that a filtered x/y-position is available after capturing all partial sums $\Sigma_1$ to $\Sigma_n$. In this example the filter coefficient a may be chosen as 0<a<1. The filter coefficient a should be less than 1 but not smaller than 0; a filter coefficient of 0 switches the filter off. The larger a becomes the longer the integration period will be (the lower the filter cut-off frequency will be).

Figures 7, 8:
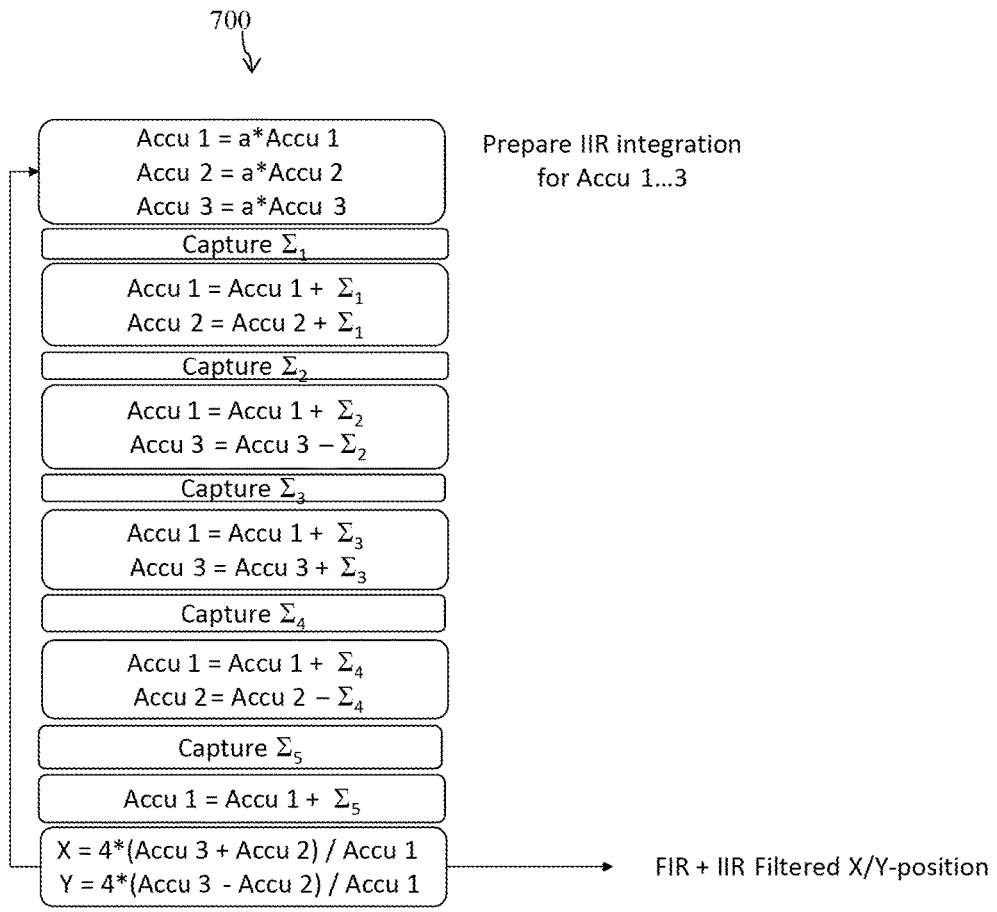
FIG. 7 shows an illustrative embodiment of a scan loop for a 5-field two-dimensional sensor.
FIG. 8 shows an illustrative embodiment of a 6-field two-dimensional sensor.

FIG. 7 shows an illustrative embodiment of a scan loop for a 5-field two-dimensional sensor. This scan loop 700 performs the following functions: direct FIR-filtering of the measured capacitance values, IIR-filtering of the position components (sum and partial sums), high-pass filtering of partial sums by creation of sample differences, and position calculation from IIR-filtered position components. The scan loop 700 may start with setting the feedback gain of the IIR filters by multiplying the accumulators (Accu1, Accu2, Accu3) by the filter coefficient a. Subsequently all partial sum samples are captured and immediately added to the required accumulators. When all partial sum samples have been captured the x- and y-positions are calculated from the accumulator contents. In accordance with the present disclosure, no outer control loop may be required beyond the processing steps shown in FIG. 7. Furthermore, the strength of the position filtering may be set by a single parameter, the filter coefficient a. Capturing of the partial sums may be interrupted when the A/D-conversion of one partial sum has been executed. It may be possible to run the scan loop 700 periodically, triggered by a system clock event. Since the accumulators do not require a reset, the scan loop 700 may be re-entered at any time. In case of the 5-field sensor shown in FIG. 5, it may be advantageous to filter the following three components before calculating the position: $\Sigma_{14}=\Sigma_1-\Sigma_4$, $\Sigma_{32}=\Sigma_3-\Sigma_2$, and $E=\Sigma_1+\Sigma_3+\Sigma_4+\Sigma_5$.

FIG. 8 shows an illustrative embodiment of a 6-field two-dimensional sensor. In particular, on the left side a 6-field two-dimensional sensor layout 800 is shown. On the right side the same sensor is shown, in which weights 802 have been assigned to each sensing element. In accordance with the present disclosure, this 6-field two-dimensional sensor may be implemented using an electronic device of the kind set forth. For example, the sensor may be implemented by an arrangement similar to that shown in FIG. 3, comprising six sense capacitors instead of three. The evaluation of the six sense capacitors is illustrated in Table 7.

TABLE 7

| Scan | $X_1$ | $X_2$ | $X_3$ | $X_4$ | $X_5$ | $X_6$ | Comment |
|---|---|---|---|---|---|---|---|
| 1 |   | X | X | X | X | X | $\Sigma_1 = 0 + Xn_2 + Xn_3 + 0 + 0 + 0$ |
| 2 | X |   | X | X | X | X | $\Sigma_2 = Xn_1 + 0 + Xn_3 + 0 + 0 + 0$ |
| 3 | X | X |   | X | X | X | $\Sigma_3 = Xn_1 + Xn_2 + 0 + 0 + 0 + 0$ |
| 4 | X | X | X |   | X | X | $\Sigma_4 = 0 + 0 + 0 + 0 + Xn_5 + Xn_6$ |
| 5 | X | X | X | X |   | X | $\Sigma_5 = 0 + 0 + 0 + Xn_4 + 0 + Xn_6$ |
| 6 | X | X | X | X | X |   | $\Sigma_6 = 0 + 0 + 0 + Xn_4 + Xn_5 + 0$ |
| 1-6 |   |   |   |   |   |   | $\Sigma_{13} = \Sigma_1 + \Sigma_2 + \Sigma_3$ |
|   |   |   |   |   |   |   | $\Sigma_{46} = \Sigma_4 + \Sigma_5 + \Sigma_6$ |
|   |   |   |   |   |   |   | $\Sigma = \Sigma_{13} + \Sigma_{46}$ |

The calculation of the x- and y-positions may be performed as follows. The x-position may be obtained by assigning the x-position-weights to the partial sums:

$$Pos_x = 2*(\Sigma_1-\Sigma_3+\Sigma_4-\Sigma_6)/(\Sigma_{13}+\Sigma_{46})$$

The y-position may be obtained by assigning the y-position-weights to the partial sums $\Sigma_{13}$ and $\Sigma_{46}$:

$$Pos_y = \Sigma_{13}/(\Sigma_{13}+\Sigma_{46})$$

Figure 9:
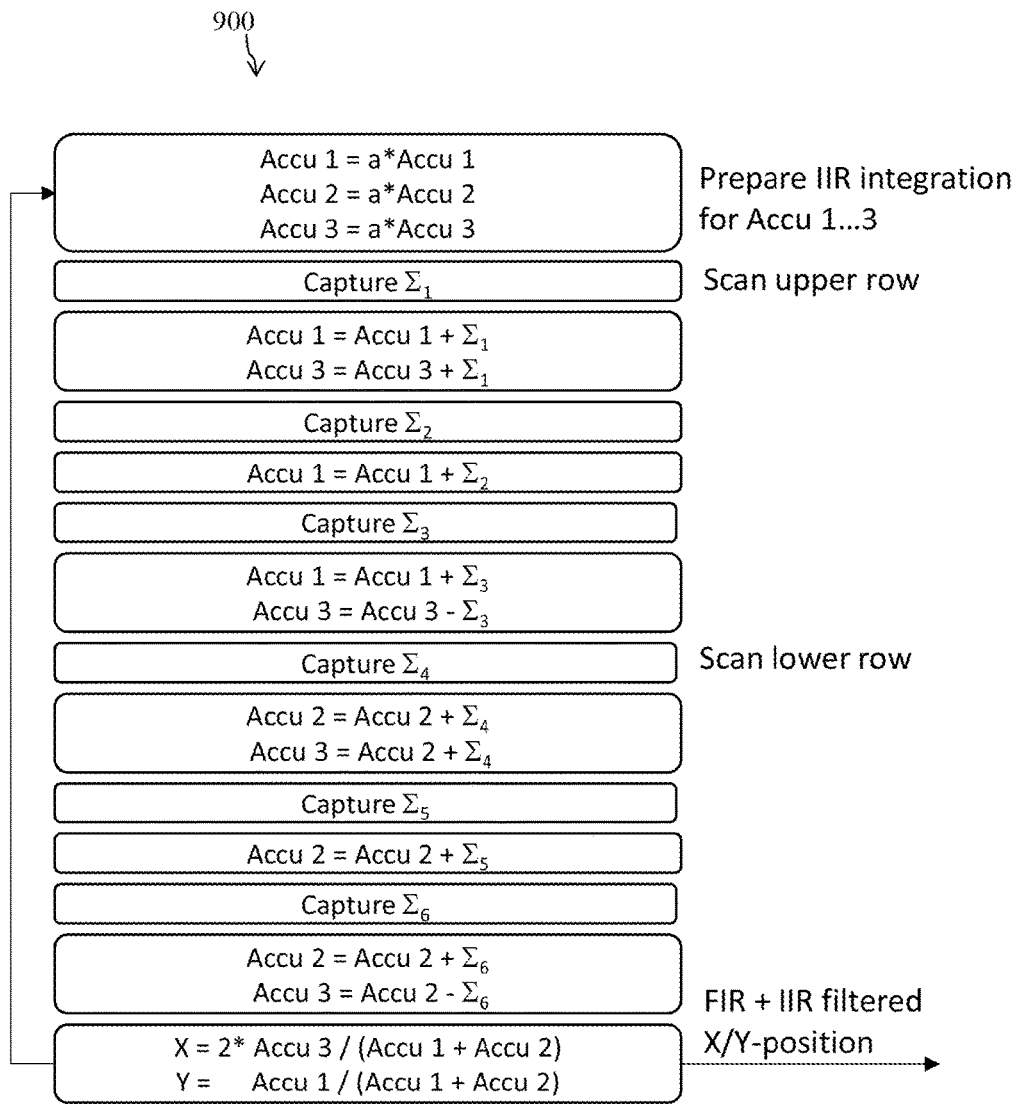
FIG. 9 shows an illustrative embodiment of a scan loop for a 6-field two-dimensional sensor.

FIG. 9 shows an illustrative embodiment of a scan loop 900 for a 6-field two-dimensional sensor. Again, three position components may be required to calculate the x/y-position. The processing steps that may be required to obtain a filtered x/y-position from a 6-field sensor, organized as two rows of 3 sensing elements, are shown FIG. 9. In total three accumulators may be used for capturing the partial sums.

FIG. 10 shows an illustrative embodiment of a 9-field two-dimensional sensor. In particular, on the left side a 9-field two-dimensional sensor layout 1000 is shown. On the right side the same sensor is shown, in which weights 1002 have been assigned to each sensing element. In accordance with the present disclosure, this 9-field two-dimensional sensor may be implemented using an electronic device of the kind set forth. For example, the sensor may be implemented by an arrangement similar to that shown in FIG. 3, comprising nine sense capacitors instead of three. The evaluation of the nine sense capacitors is illustrated in Table 8. More specifically, the left side of FIG. 10 shows the position of nine individual sensing elements (corresponding to sense capacitors) while the right side of FIG. 10 shows the x- and y-position weights assigned to each individual sensing element, as may be required to perform a center-of-gravity calculation. The scanning steps and the resulting partial sums are shown in Table 8.

TABLE 8

| Scan | $X_1$ | $X_2$ | $X_3$ | $X_4$ | $X_5$ | $X_6$ | $X_7$ | $X_8$ | $X_9$ | Comment |
|---|---|---|---|---|---|---|---|---|---|---|
| 1 |   | X | X | X | X | X | X | X | X | $\Sigma_1 = 0 + Xn_2 + Xn_3 + Xn_4 + Xn_5 + Xn_6 + Xn_7 + Xn_8 + Xn_9$ |
| 2 | X |   | X | X | X | X | X | X | X | $\Sigma_2 = Xn_1 + 0 + Xn_3 + Xn_4 + Xn_5 + Xn_6 + Xn_7 + Xn_8 + Xn_9$ |
| 3 | X | X |   | X | X | X | X | X | X | $\Sigma_3 = Xn_1 + Xn_2 + 0 + Xn_4 + Xn_5 + Xn_6 + Xn_7 + Xn_8 + Xn_9$ |
| 4 | X | X | X |   | X | X | X | X | X | $\Sigma_4 = Xn_1 + Xn_2 + Xn_3 + 0 + Xn_5 + Xn_6 + Xn_7 + Xn_8 + Xn_9$ |
| 5 | X | X | X | X |   | X | X | X | X | $\Sigma_5 = Xn_1 + Xn_2 + Xn_3 + Xn_4 + 0 + Xn_6 + Xn_7 + Xn_8 + Xn_9$ |
| 6 | X | X | X | X | X |   | X | X | X | $\Sigma_6 = Xn_1 + Xn_2 + Xn_3 + Xn_4 + Xn_5 + 0 + Xn_7 + Xn_8 + Xn_9$ |
| 7 | X | X | X | X | X | X |   | X | X | $\Sigma_7 = Xn_1 + Xn_2 + Xn_3 + Xn_4 + Xn_5 + Xn_6 + 0 + Xn_8 + Xn_9$ |
| 8 | X | X | X | X | X | X | X |   | X | $\Sigma_8 = Xn_1 + Xn_2 + Xn_3 + Xn_4 + Xn_5 + Xn_6 + Xn_7 + 0 + Xn_9$ |
| 9 | X | X | X | X | X | X | X | X |   | $\Sigma_9 = Xn_1 + Xn_2 + Xn_3 + Xn_4 + Xn_5 + Xn_6 + Xn_7 + Xn_8 + 0$ |
| 1-9 |   |   |   |   |   |   |   |   |   | $\Sigma = \Sigma_1 + \Sigma_2 + \Sigma_3 + \Sigma_4 + \Sigma_5 + \Sigma_6 + \Sigma_7 + \Sigma_8 + \Sigma_9$ |
|   |   |   |   |   |   |   |   |   |   | $\Sigma = 8*Xn_1 + 8*Xn_2 + 8*Xn_3 + 8*Xn_4 + 8*Xn_5 + 8*Xn_6 + 8*Xn_7 + 8*Xn_8 + 8*Xn_9$ |

In this example, the x/y-position may be obtained directly from the partial sums $\Sigma_1$ to $\Sigma_9$ as shown below:

$$Pos_x = 8*(\Sigma_1-\Sigma_3+\Sigma_4-\Sigma_6+\Sigma_7-\Sigma_9)/\Sigma$$

$$Pos_x = 8*((\Sigma_1-\Sigma_9)+(\Sigma_7-\Sigma_3)+(\Sigma_4-\Sigma_6))/\Sigma$$

$$Pos_y = 8*(-\Sigma_1-\Sigma_2-\Sigma_3+\Sigma_7+\Sigma_8+\Sigma_9)/\Sigma$$

$$Pos_y = 8*(-(\Sigma_1-\Sigma_9)+(\Sigma_7-\Sigma_3)+(\Sigma_8-\Sigma_2))/\Sigma$$

In this example, only two divisions and a few subtraction, addition and shift operations are required for obtaining one x/y-position. In case IIR-filtering as shown in FIG. 6 is applied, the IIR-filtered partial differences $(\Sigma_1'-\Sigma_9')$, $(\Sigma_7'-\Sigma_3')$, $(\Sigma_4'-\Sigma_6')$, and $(\Sigma_8'-\Sigma_2')$ as well as the filtered sum $\Sigma'$ are required to calculate the filtered x/y-position. In accordance with the present disclosure, the partial differences may remove DC-values from the position components.

Figure 11:
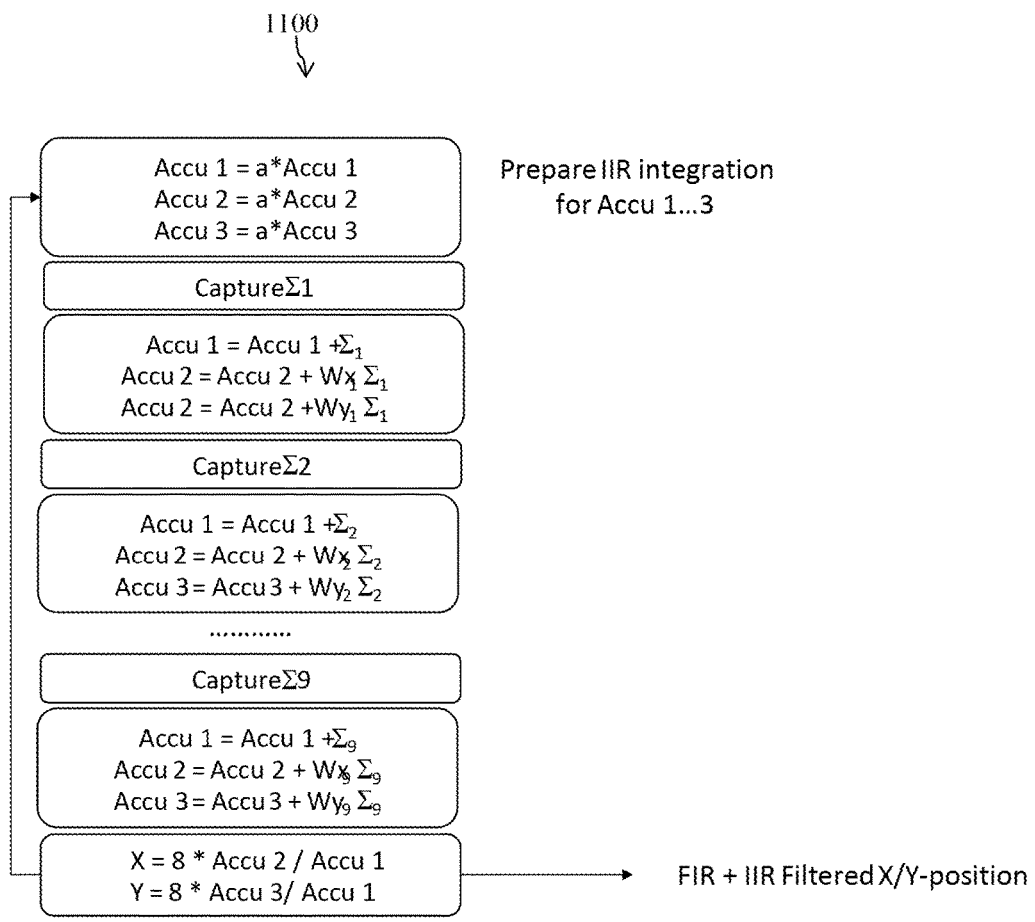
FIG. 11 shows an illustrative embodiment of a scan loop for a 9-field two-dimensional sensor.

FIG. 11 shows an illustrative embodiment of a scan loop for a 9-field two-dimensional sensor. This embodiment provides an example of a combined FIR/IIR filter-acquisition-loop for a 9-field sensor.

The general calculation of the x/y-position directly from the partial sums $\Sigma_1$ to $\Sigma_n$ is given below. In order to avoid the effort of two-dimensional position noise filtering it may be advantageous to apply filtering (for an n-field sensor) only to the following three components before position calculation:

$$\Sigma_x = -(2^n)*[Wx_1*\Sigma_1+Wx_2*\Sigma_2+\ldots+Wx_n*\Sigma_n]$$

$$\Sigma_y = -(2^n)*[Wy_1*\Sigma_1+Wy_2*\Sigma_2+\ldots+Wy_n*\Sigma_n]$$

$$\Sigma = \Sigma_1+\Sigma_2+\ldots+\Sigma_n$$

Herein, $Wx_n$ and $Wy_n$ are the position weight factors for weighted averaging; $Wx_i/Wy_i$ practically define the position of the center of sensor i in a reference plane.

The presently disclosed electronic device may be used to advantage in a smart card. For instance, a typical application of a five-sensor structure is a keypad or PIN pad for smart cards, e.g. for authentication purposes in banking and payment applications. In case of a touch by a human finger the identified touch position may be communicated to a secure element embedded in the smart card, for personal identification number (PIN) decoding and PIN matching. Another implementation of the touch processing sequence may be the physical integration as a hardware component into a microcontroller, because the simplicity of the sequence of processing steps may support an efficient implementation with an economic gate-count. Furthermore, a 3×3 sensor structure may also be applied as a user input interface for a wide range of consumer devices with touchpad sizes of up to 60×60 mm.

It is noted that the embodiments above have been described with reference to different subject-matters. In particular, some embodiments may have been described with reference to method-type claims whereas other embodiments may have been described with reference to apparatus-type claims. However, a person skilled in the art will gather from the above that, unless otherwise indicated, in addition to any combination of features belonging to one type of subject-matter also any combination of features relating to different subject-matters, in particular a combination of features of the method-type claims and features of the apparatus-type claims, is considered to be disclosed with this document.

Furthermore, it is noted that the drawings are schematic. In different drawings, similar or identical elements are provided with the same reference signs. Furthermore, it is noted that in an effort to provide a concise description of the illustrative embodiments, implementation details which fall into the customary practice of the skilled person may not have been described. It should be appreciated that in the development of any such implementation, as in any engineering or design project, numerous implementation-specific decisions must be made in order to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill.

Finally, it is noted that the skilled person will be able to design many alternative embodiments without departing from the scope of the appended claims. In the claims, any reference sign placed between parentheses shall not be construed as limiting the claim. The word "comprise(s)" or "comprising" does not exclude the presence of elements or steps other than those listed in a claim. The word "a" or "an" preceding an element does not exclude the presence of a plurality of such elements. Measures recited in the claims may be implemented by means of hardware comprising several distinct elements and/or by means of a suitably programmed processor. In a device claim enumerating several means, several of these means may be embodied by one and the same item of hardware. The mere fact that certain measures are recited in mutually different dependent claims does not indicate that a combination of these measures cannot be used to advantage.

LIST OF REFERENCE SIGNS 100 electronic device
102 voltage input
104 analog-to-digital converter
108 sense capacitor
110 sample-and-hold capacitor
112 switch
114 switch
116 switch
200 electronic device
202 sample-and-hold capacitor
204 switch
300 electronic device
302 general-purpose input/output pin
304 general-purpose input/output pin
306 general-purpose input/output pin
308 general-purpose input/output pin
310 sense capacitor
312 sense capacitor
314 sense capacitor
400 position capturing device
402 microcontroller
404 memory
406 central processing unit
410 position acquisition function
412 position filtering function
414 outer finite-impulse-response filter loop
416 inner touch loop
500 5-field 2D sensor layout
502 5-field 2D sensor weights
600 filtering of partial sum values
700 scan loop for a 5-field 2D sensor
800 6-field 2D sensor layout
802 6-field 2D sensor weights
900 scan loop for a 6-field 2D sensor
1000 9-field 2D sensor layout
1002 9-field 2D sensor weights
1100 scan loop for a 9-field 2D sensor

The invention claimed is:

1. An electronic device for use in a touch-based user interface, the electronic device comprising a set of first capacitors, a second capacitor, a third capacitor, and an analog-to-digital converter, wherein:

the set of first capacitors and the second capacitor each have a first terminal that are coupled to each other through a set of first switches;

the first terminal of each capacitor of the set of first capacitors is coupled to an input of the analog-to-digital converter through a first switch of the set of first switches, the first terminal of each of the first capacitors is coupled to a voltage input terminal through a second switch, a second terminal of each of the first capacitors is coupled to the voltage input terminal through a third switch, and the second terminal of each of the first capacitors is coupled to a voltage reference terminal through a fourth switch, and wherein the set of first capacitors are sensing capacitors and each capacitor of the set of first capacitors corresponds to a position in an array of sensing elements which represent a multi-channel touch sensor;

the first terminal of the second capacitor is coupled to the input of the analog-to-digital converter, and a second terminal of the second capacitor is coupled to the voltage reference terminal;

a first terminal of the third capacitor is coupled to the first terminal of each of the first capacitor, and a second terminal of the third capacitor is coupled to the voltage reference terminal;

the third capacitor is coupled to the second capacitor through the first switch;

the third capacitor is coupled to the input of the analog-to-digital converter through the first switch.

2. The electronic device of claim 1, wherein the third capacitor is implemented as a printed circuit board capacitor made from neighboring tracks on the printed circuit board.

3. The electronic device of claim 1, being configured to derive individual capacitances on the first capacitors from partial sum values, wherein said partial sum values are obtained by measuring and adding together combined capacitances on subsets of the set of first capacitors.

4. The electronic device of claim 3, further being configured to measure capacitances on mutually different subsets of the set of first capacitors.

5. The electronic device of claim 3, further being configured to apply a weighting factor to the partial sum values.

6. The electronic device of claim 5, further being configured to regroup the weighted partial sum values, thereby yielding high-pass filter terms.

7. The electronic device of claim 3, further being configured to filter the partial sum values.

8. The electronic device of claim 7, further being configured to use an infinite-impulse-response filter for filtering the partial sum values.

9. The electronic device of claim 1, wherein the first capacitors are coupled to general-purpose input/output pins.

10. The electronic device of claim 9, wherein the general-purpose input/output pins, the analog-to-digital converter and the second capacitor form part of a microcontroller unit.

11. A smart card comprising the electronic device of claim 1.

12. A method of manufacturing an electronic device for use in a touch-based user interface, the method comprising providing the electronic device with a first capacitor, a second capacitor, a third capacitor, and an analog-to-digital converter, wherein:
the set of first capacitors and the second capacitor each have a first terminal that are coupled to each other through a first switch;
the first terminal of each capacitor of the set of first capacitors is coupled to an input of the analog-to-digital converter through the first switch, the first terminal of each of the first capacitors is coupled to a voltage input terminal through a second switch, a second terminal of each of the first capacitors is coupled to the voltage input terminal through a third switch, and the second terminal of each of the first capacitors is coupled to a voltage reference terminal through a fourth switch;
the first terminal of the second capacitor is coupled to the input of the analog-to-digital converter, and a second terminal of the second capacitor is coupled to the voltage reference terminal;
a first terminal of the third capacitor is coupled to the first terminal of the first capacitor, and a second terminal of the third capacitor is coupled to the voltage reference terminal;
the third capacitor is coupled to the second capacitor through the first switch;
the third capacitor is coupled to the input of the analog-to-digital converter through the first switch.

* * * * *